(12) United States Patent
Spilman et al.

(10) Patent No.: US 8,014,069 B2
(45) Date of Patent: Sep. 6, 2011

(54) POLARIZATION CONVERTER, OPTICAL SYSTEM, METHOD AND APPLICATIONS

(75) Inventors: Alexis K. Spilman, Rochester, NY (US); Thomas G. Brown, Rochester, NY (US)

(73) Assignee: University of Rochester, Rochester, NY (US)

( * ) Notice: Subject to any disclaimer, the term of this patent is extended or adjusted under 35 U.S.C. 154(b) by 429 days.

(21) Appl. No.: 12/143,165

(22) Filed: Jun. 20, 2008

(65) Prior Publication Data

US 2009/0040602 A1 Feb. 12, 2009

Related U.S. Application Data

(63) Continuation-in-part of application No. 11/395,978, filed on Mar. 31, 2006, now abandoned.

(60) Provisional application No. 60/945,168, filed on Jun. 20, 2007.

(51) Int. Cl.
*G02B 5/30* (2006.01)
*G02B 3/10* (2006.01)
*G03B 27/54* (2006.01)

(52) U.S. Cl. ............ 359/489.01; 359/721; 355/67
(58) Field of Classification Search ............ 359/489.01
See application file for complete search history.

(56) References Cited

U.S. PATENT DOCUMENTS

2001/0012154 A1* 8/2001 Schuster ............ 359/497
2004/0223212 A1* 11/2004 Sakuma ............ 359/355
* cited by examiner

*Primary Examiner* — Stephone B Allen
*Assistant Examiner* — Jade R Chwasz
(74) *Attorney, Agent, or Firm* — William Greener; Bond, Schoeneck & King, PLLC

(57) ABSTRACT

A stress-induced polarization converter in the form of a zero power optical window or, alternatively, a single element, positive or negative power optical lens, that is subject to a controlled amount of symmetric, peripheral stress. The stress may be provided by appropriate mechanical, thermal, hydraulic, electromagnetic/piezo, annealing/molding, or other known techniques and may be trigonal or four-fold. Axial foci can be created by applying the controlled, symmetric, peripheral stress. The separation distance between the foci can be controlled by controlling the magnitude of the applied symmetric, peripheral stress.

7 Claims, 22 Drawing Sheets

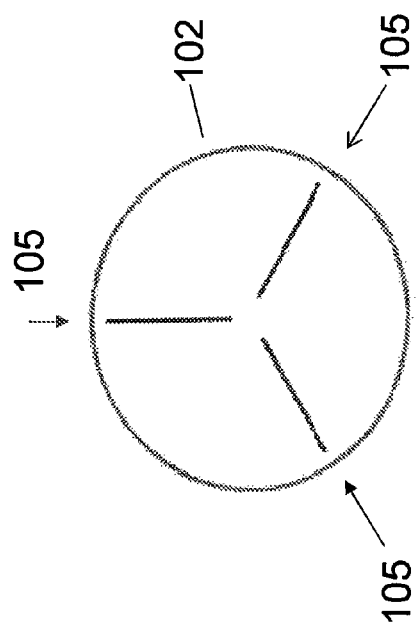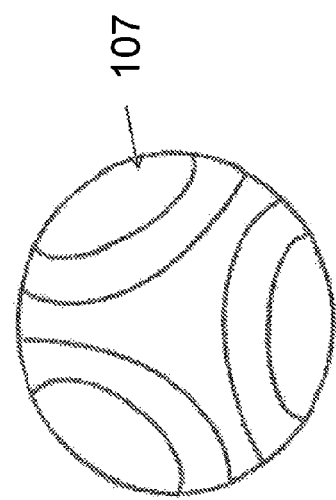
FIG. 1a
FIG. 1b

POLARIZATION CONVERTER, OPTICAL SYSTEM, METHOD AND APPLICATIONS

RELATED APPLICATION DATA

The instant application is a continuation-in-part of, and claims priority to, U.S. application Ser. No. 11/395,978 filed on Mar. 31, 2006, which itself claims priority to U.S. provisional application Ser. No. 60/667,232 filed on Apr. 1, 2005; and also claims priority to U.S. provisional application Ser. No. 60/945,168 filed on Jun. 20, 2007, the subject matter of all of which are incorporated herein by reference in their entireties as though fully set forth herein.

FEDERALLY SPONSORED RESEARCH

Not applicable.

BACKGROUND

Field of the Invention

Embodiments of the invention are most generally related to the field of polarized light and associated optical systems. More particularly, embodiments of the invention are directed to a stress-induced, refractive, polarization converter device; a split-foci optical system including a stress-induced, polarization converter device; a method for obtaining split-axial-foci; and applications utilizing such devices, systems and methods.

Imaging systems are important in science, technology, and everyday use. Microscopes are essential for inspection of small objects, including automated inspection of manufactured products and tools for use in manufacturing. Photographic systems are designed to capture images of larger objects at various distances. Most imaging systems are designed to form an image at a certain plane or surface, the position of which, relative to the lens, may be adjusted in order to bring an object into sharp focus. Objects closer to, or farther away from, the sharply imaged object will be out of focus and appear as blurred features on the image sensor. The range of object positions over which the image on a fixed image sensor will remain clearly resolved is called the depth of field of the optical instrument.

Some optical systems are designed to focus on a single surface and reject light coming from features that are out of focus. For example, a confocal microscope is designed to image a target object (e.g., biological tissue) in such a way that only a single, lateral (i.e., two-dimensional in the x-y plane) slice of the object will be acquired and displayed by the microscope. One slice at a time is acquired until a desired or necessary three-dimensional content (i.e., along the axial, z-axis direction) of the object is acquired and stored.

Some optical systems are designed to provide an increased depth of field. One known way to optically increase the depth of field is by lowering the numerical aperture (NA) of the imaging lens; i.e., the depth of focus scales as the ratio of the wavelength to the square of the NA, so, e.g., a five-fold decrease in numerical aperture will yield a twenty five-fold increase in depth of focus. However, since the amount of light collected by the lens also decreases as the square of the NA, using this approach to increase depth of focus may not always be desirable. A smaller NA value also corresponds to decreased lateral resolution.

The cubic phase mask disclosed in the published literature by Dowski et al., and the logarithmic asphere disclosed by George et al., are two examples of components and techniques that may be used to increase the depth of field of certain optical imaging systems. Both are understood to rely on a means by which the pupil phase is distorted in order to create a point spread function that is invariant over a specified range of focus positions. These apparatus and techniques can facilitate the removal of blur from the image in a deterministic fashion.

Other apparatus and techniques are also known. There exist lenses that create a small number of discrete focal regions distributed along the optical axis of a lens. A zone plate may be configured to have multiple foci. An anisotropic crystal whose optic axis is aligned with the optical axis of a lens may produce two images displaced along the axis. Each of these approaches, however, requires materials that may be expensive, fragile, or which require specialized fabrication.

Stress birefringence is ubiquitous in optical elements and great effort is typically expanded to mitigate its effects, particularly in demanding applications such as lithography and microscopy. The instant parent application, to which the instant application claims priority, disclosed, among other things, a polarization converter in which high (>10 MPa) stress could be induced by symmetric forces applied around the periphery of a cylindrical glass window. Of particular interest were the vortex structures that occur with certain stress symmetries when the phase retardance exceeds a half-wave. We illustrated how a trigonal stress pattern can form an annular region that produces polarization vortices under linearly polarized illumination.

Polarization vortices are only one category of a wider variety of optical phenomena that can be observed in windows exhibiting stress birefringence. For example, Dennis et al. reported on the unique polarization properties and interesting optical effects of vortex beams with half-integer topological charge. Spilman et al. reported that scalar vortices are produced when an optical window under trigonal symmetric stress birefringence distribution is illuminated with circular polarization.

It is known that birefringent elements can split the focus of an optical system. A common example of this occurs in differential interference contrast (DIC) microscopy, in which a birefringent element is used to laterally displace two orthogonal polarizations. DIC can provide useful information such as lateral index gradients and local birefringence. The double focus enables highly sensitive differential imaging for both wide field and confocal systems.

Thus the ability to create discrete, axially displaced focal regions (axial split foci) in an optical imaging system can have important applications. For example, an imaging system may be designed with a sharp focus for two separated planes such as, e.g., the opposite faces of a parallel glass window. A confocal imaging system may be designed for simultaneous acquisition of two separated surface images thus allowing target imaging at two different axial depths. A nonlinear imaging system such as a two-photon microscope may create two-photon fluorescence at two separated planes, increasing the effective depth of field while maintaining high fluence.

The inventors recognize the various advantages and benefits that would result from an axial-split-foci imaging system that could be constructed using a simple lens and/or a parallel-face window. Further benefits and advantages may be realized by an appreciation that an isotropic material, when placed under appropriate stress, will develop anisotropic optical behavior according to the magnitude and direction of the principal components of the stress tensor. If the material is under nonuniform stress, the resulting birefringence will be nonuniform. A nonuniform birefringence produces light which is inhomogeneously polarized even when illuminated with a beam having uniform polarization. Accordingly, in an imaging system, pupil illumination with a polarization that varies spatially and in a continuous manner throughout the pupil may offer many advantages including, but not limited to, e.g., higher resolution and higher longitudinally polarized fields at the focus of the condenser.

SUMMARY

An embodiment of the invention is a stress-induced, refractive polarization converter. According to an aspect, a single element, optical lens is characterized by a stress birefringence induced by an applied symmetric, peripheral stress. According to various aspects, the stress is provided by an appropriate lens housing assembly that applies symmetric, peripheral stress via mechanical, thermal, hydraulic, electromagnetic/piezo, annealing/molding, or other known techniques. The applied symmetric stress will advantageously be trigonal or four-fold, but is not so limited. In various advantageous aspects, the polarization converter will exhibit greater than about one-quarter wave of phase retardation, greater than about one-wave of phase retardation and, at least two waves of phase retardation, over at least a portion of the clear aperture of the lens. In an aspect, the lens is a positive lens. Alternatively, the lens may be a negative lens. Advantageously, the lens will be sufficiently free from aberrations when under stress. The stressed lens or window will be characterized by a smoothly varying birefringence that, near center, will exhibit substantially circular contours of equal birefringence. When illuminated by circularly polarized light, the polarization converter will produce concentric rings of alternating right and left circular polarization.

An embodiment of the invention is an optical system that includes at least one of a stress-induced, refractive polarization converter as described herein or a stress-induced, window-type polarization converter as described in the parent application. A system for producing axial-split-foci in accordance with an illustrative embodiment of the invention includes a circularly polarized input light source/assembly and a polarization converter disposed to receive the input light. According to an aspect, the polarization converter is a stressed birefringent window, wherein the system further includes a focusing element disposed to act on the light transmitted through the window. Alternatively, the polarization converter is a stressed lens having positive or negative focusing ability. According to various aspects, the optical system may be an imaging system or an illumination system.

Non-limiting examples of optical systems as embodied herein include confocal microscopy and endoscopy systems; optical coherence tomography (OCT) systems; optical data storage systems; projection systems; camera systems exhibiting increased depth of field; semiconductor wafer inspection systems; ophthalmic systems, and others as will be appreciated by those skilled in the art.

A method for producing split-axial-foci in accordance with an embodiment of the invention includes transmitting circularly polarized illumination through a polarization converter device comprising a transparent optical material that is or has been exposed to a symmetric stress pattern, and bringing the transmitted beam to a focus. According to non-limiting exemplary aspects, the stress is a symmetric trigonal (N=3) stress or a symmetric four-fold (N=4) stress. The stressed transparent optical material may be a single element positive or negative lens or a parallel face window (in which case a separate, non-stressed focusing element would provide focusing).

According to an illustrative aspect, a method for producing a double axial (split) focus includes providing a refracting lens of optically transparent material; providing a desired amount of symmetric stress to the periphery of the lens; and, propagating circularly polarized input illumination through the lens. In non-limiting, exemplary aspects, a desired amount of trigonal or four-fold symmetric stress is applied to the lens. In various aspects, this may be achieved mechanically, thermally, hydraulically, piezo-electrically (or with other electromagnetic transducers capable of generating sufficient force), via annealing and molding to create intrinsic stress, and otherwise as those skilled in the art would understand. According to an exemplary aspect, providing circularly polarized input illumination may include known means for converting unpolarized or linearly polarized light into circularly polarized light. The lens may be a single element, positive or negative lens. According to an alternative aspect, the stressed lens may be replaced by a similarly stressed window located in an aperture stop or entrance/exit pupil plane of a system and a non-stressed focusing element located appropriately in the optical train.

BRIEF DESCRIPTION OF THE FIGURES

FIG. 1a, b illustrate the basic principle of trigonal stress birefringence in accord with the various embodiments of the invention;

FIG. 6a shows a photo-reproduction of a window held under trigonal symmetric stress exhibiting rings of equal retardance according to an illustrative aspect of the invention; FIG. 6b shows an expanded view of the center region of the photograph of FIG. 6a;

DETAILED DESCRIPTION OF CERTAIN EMBODIMENTS OF THE INVENTION

The basic principle of trigonal stress birefringence is illustrated in FIGS. 1a and 1b. If a material, for example, a glass window 102, is placed under symmetric trigonal stress as indicated by arrows 105 in FIG. 1a, the associated stress tensor will have principle axes that follow the symmetry of the stress. This stress induces a birefringence pattern 107 as shown in FIG. 1b.

In our copending parent application, we disclosed an exemplary polarization converter comprising an optically transparent BK7 glass window surrounded by a copper stress transfer sleeve and an aluminum housing. The housing contained three symmetrically positioned threaded bores for receiving respective set screws. The set screws could be screwed in/out to adjust the amount of force exerted on the stress sleeve to induce a desired stress in the window. If the location and amount of stress is controlled as described therein, a smooth, symmetric and continuous stress birefringence pattern 107 as shown in FIG. 1b can be induced over the clear aperture of the window. By controlling the magnitude of the stress, the phase retardance can be controlled until at least one wave of retardance exists in a region smaller than the diameter of the window.

Figure 6:
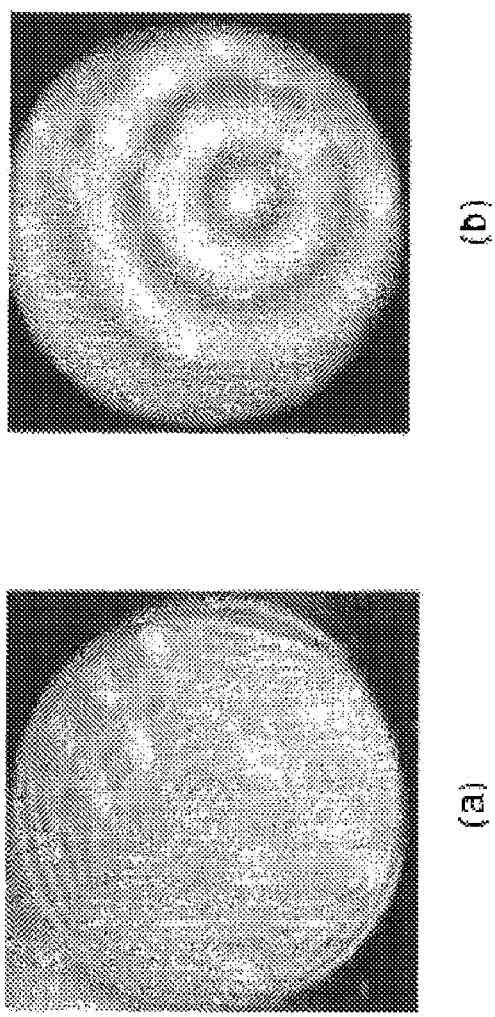

The inventors have determined that a half inch diameter BK7 glass window, with a thickness of 8 mm, will require pressures of greater than 100 MPa in order to provide more than one wave of stress birefringence in a circular region near the center of the window. According to an alternative, non-limiting, exemplary aspect as illustrated schematically by polarization converter 200-1 in FIG. 2, a stainless steel ring was fabricated with an inner diameter about 25 μm less than the outer diameter of the window. Material was removed from the inside of the ring in three regions, each 120 degrees apart, to provide trigonal symmetry. Both materials were heated to a temperature of greater than 300 degrees C. until the greater thermal expansion coefficient of the metal ring provided an inner diameter greater than the outer diameter of the glass window. The glass was inserted in the ring and the apparatus was cooled. The resulting stress provided about eight circular rings near the center, each with a phase retardance having integer multiples of one wavelength. This is shown in FIG. 6.

Figures 3A, 3B:
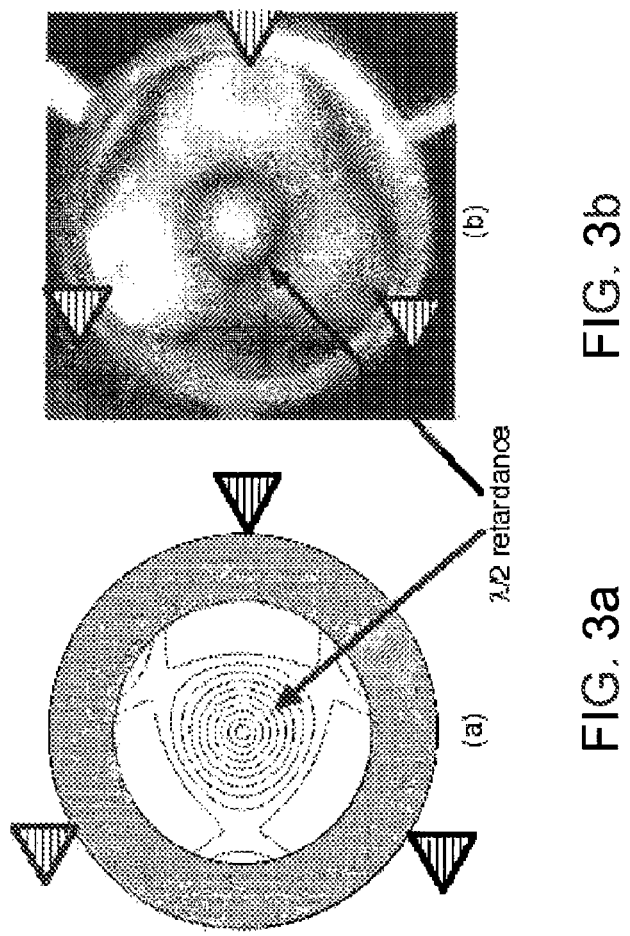
FIG. 3a illustrates a finite element model showing contours of equal retardance near the center of a window under trigonal stress according to an exemplary aspect of the invention.
FIG. 3b is a photo-reproduction showing a stressed window viewed between circular polarizers according to an exemplary aspect of the invention.

When sufficient stress is applied to the window a series of rings of constant birefringence form near the center of the window as schematically illustrated in FIG. 3a. The center will have zero birefringence, and at least one ring will have one wave of birefringence. With sufficient stress, an additional ring corresponding to two waves of birefringence will appear, and so on. Beyond a region of about one-half of the diameter of the window, the contours of equal birefringence no longer appear circular.

Contours of equal birefringence may be viewed using, e.g., circular polarizers such as are used as photographic filters or glare reduction filters on computer screens. FIG. 3b shows such a view, in which circularly polarized light is passed through the window and then through a circular analyzer, which passes right hand circular (RHC) light but blocks left hand circular (LHC) light. In such a view, the dark regions are contours of half-integer retardation (e.g., half-wave, one-and-one-half wave, etc.), while the bright regions are regions of birefringence equal to a multiple of one wavelength. Thus different colors will exhibit different radii for multiple waves of retardation.

A basic understanding of stress may be helpful to the reader to understand the mechanics of a space-variant (stress birefringence) waveplate as described herein. Stress is a measure of force per unit area and is represented by σ, which is measured in Pascals, or Newtons per meter squared ($N/m^2$). When a stress is applied to the exterior of a material (e.g., the window), atoms are displaced within the material and there results a differential displacement of atoms. If u represents a vector displacement and the partial derivatives of u represent internal forces, which are measured as stress, then the outer product of the gradient operator and the displacement forms the stress tensor, represented by the matrix:

$$\begin{bmatrix} \sigma_x & \sigma_{xy} \\ \sigma_{yx} & \sigma_y \end{bmatrix}$$

The stress tensor is directly proportional to the birefringence and, when diagonalized, gives the principle axes. The stress matrix determines the birefringence. The internal stress leads to a change in refractive index of the glass window.

Theory

External forces displace atoms in the glass matrix, giving rise to a stress tensor that determines the local birefringence. In a matrix representation, stress and birefringence are related in the following fashion where $\sigma_{11}$ and $\sigma_{22}$ are the values of principal stress and R is the 2×2 rotation matrix identifying the direction of principal stress:

$$[R(\theta)]^{-1} \begin{bmatrix} \sigma_{xx} & \sigma_{xy} \\ \sigma_{yx} & \sigma_{yy} \end{bmatrix} [R(\theta)] = \begin{bmatrix} \sigma_{11} & 0 \\ 0 & \sigma_{22} \end{bmatrix}. \quad (1)$$

The retardance in optical path $\Gamma=\eta t$ is the product of the birefringence, $\eta=|\Delta n_1 - \Delta n_2|$ with material thickness, t. $\Delta n_1$ and $\Delta n_2$ have the usual dependence on the stress; i.e., $\Delta n_1 = k_{11}\sigma_{11} + k_{12}\sigma_{22}$ and $\Delta n_2 = k_{11}\sigma_{22} + k_{12}\sigma_{11}$ are assumed and $k_{ij}$ are the stress optical coefficients.

In our illustrative optical model, the optical waves traveling through the window are confined to a paraxial region about the direction perpendicular to the window (z axis). While the general theory of wave propagation in such a medium has a spatially varying set of principal axes in three dimensions, our model assumes that every point has one principal axis in the direction of propagation, with the remaining two principal axes aligned with the directions of transverse principal stress. This allows us to define a space-variant Jones matrix assuming a principal stress direction $\theta$ and a magnitude of retardance $\delta$, which are assumed to be functions of the normalized polar coordinates of the window:

$$M(\rho, \varphi) = \begin{pmatrix} \cos\theta & \sin\theta \\ -\sin\theta & \cos\theta \end{pmatrix} \begin{pmatrix} e^{i\delta/2} & 0 \\ 0 & e^{-i\delta/2} \end{pmatrix} \begin{pmatrix} \cos\theta & -\sin\theta \\ \sin\theta & \cos\theta \end{pmatrix}. \quad (2)$$

In general, the input polarization will be uniform and specified by a single Jones vector $E_{in}$. For exemplary circularly polarized illumination, we may assume right hand circular input, $$E_{in} = \frac{1}{\sqrt{2}} \begin{bmatrix} 1 \\ i \end{bmatrix}$$

in which $e^{-i\omega t}$ time dependence is assumed and the polarization rotation follows a right hand rule along the direction of propagation. The output polarization is space-variant, and given by $$E_{out} = M(\rho) E_{in} \quad (3)$$

For right hand circular input, the multiplication yields $$E_{out} = \frac{1}{\sqrt{2}} e^{-i\theta} \begin{pmatrix} \cos\theta e^{i\delta/2} + i\sin\theta e^{-i\delta/2} \\ -\sin\theta e^{i\delta/2} + i\cos\theta e^{-i\delta/2} \end{pmatrix}$$

A right hand circular analyzer may be modeled by left-multiplying by $$\frac{1}{\sqrt{2}} [1 \quad -i]$$

yielding $$E_{out}|_{RHC} = \cos(\delta/2). \quad (5)$$

To gather the left hand circular component of the output field, a left hand circular analyzer may be modeled by left-multiplying by $$\frac{1}{\sqrt{2}} [1 \quad i]$$

yielding $$E_{out}|_{LHC} = ie^{-2\theta} \sin(\delta/2). \quad (6)$$

We further assume that the principal stress direction rotates in proportion to the polar angle ($\theta = \beta\phi$). $\beta$ is determined from the symmetry of the stress according to the rule $\beta = (2-m)/2$, in which m denotes the symmetry of the applied stress. Finite element modeling (FIG. 3a) verifies that, for m=3, the retardance is proportional to radius near the center of the piece. We will take $\delta = c\rho$, in which c is a coefficient depending on wavelength, thickness and rate of change of birefringence. c is proportional to the external applied force and represents the rate of change of the phase retardance near the center of the piece. For trigonal (m=3) stress, $\theta = -\phi/2$ and the right hand circular and left hand circular components of the output field can then be expressed as follows:

$$E_{out}|_{RHC} = \cos(c\rho/2) \quad (7)$$

and the left hand circular component becomes $$E_{out}|_{LHC} = ie^{i\phi} \sin(c\rho/2). \quad (8)$$

The left hand circular component exhibits a phase vortex while the right hand circular component has no phase vortex. The charge of the phase vortex in the left hand circular component is determined by the symmetry of the stress. In this case, m=3 stress yields a vortex of −1 topological charge. The right hand circular component shows a symmetric apodization that varies as $\cos(c\rho/2)$.

The point spread function of the waveplate may be modeled using the tools of polarization modeling combined with Fourier optics. A space-variant Jones matrix is defined as described in Eq. (2) and is multiplied by a Jones vector describing circularly polarized light. Each Cartesian component of the field amplitude is then Fourier transformed and combined in vector fashion to deduce the electric field distribution near focus. The fields in the pupil $E_x(f_x, f_y)$, $E_y(f_x, f_y)$ are related to the fields in the image $A_x(x, y)$, $A_y(x, y)$ through the following relation:

$$\begin{bmatrix} A_x(x, y) \\ A_y(x, y) \end{bmatrix} = \int\int df_x df_y \begin{bmatrix} E_x(f_x, f_y) \\ E_y(f_x, f_y) \end{bmatrix} e^{i2\pi(f_x x + f_y y)} \quad (9)$$

where (x,y) represent the coordinates of the image, $(f_x, f_y)$ represent the spatial frequencies of the image with $f_x=(NA/\lambda)\rho_x$ and $f_y=(NA/\lambda)\rho_y$, and the normalization factors are omitted. An imaging system can then be modeled by defining the incident pupil field, computing the transmitted field using the space-variant Jones matrix, transforming the pupil coordinates into dimensions of spatial frequency and assembling the vector point spread function. To model defocus, a quadratic phase error is applied to the pupil function as is customary in Fourier optics and aberration theory.

Experiment

Figure 2:
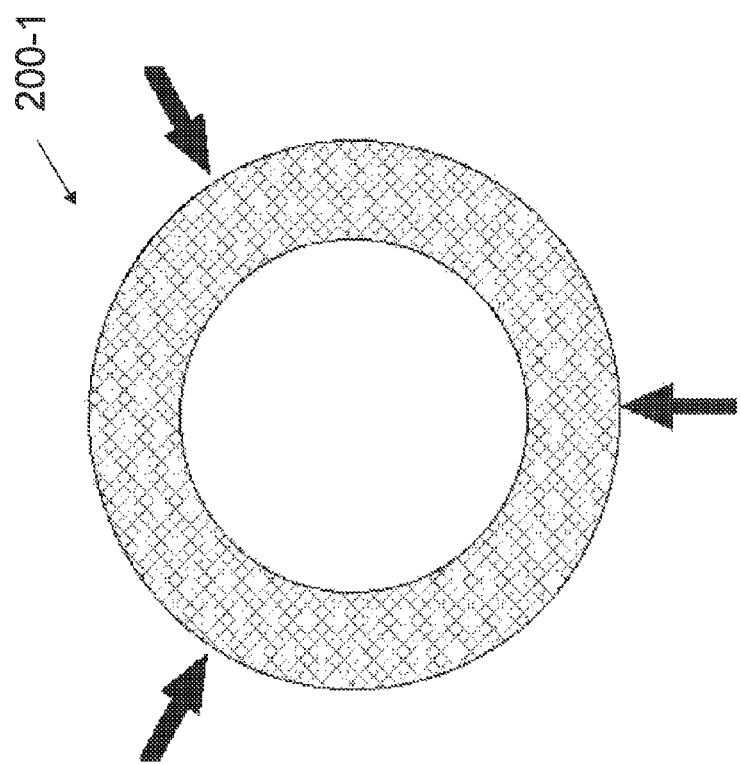
FIG. 2 schematically shows how a cylindrical window may be placed under trigonal stress according to an illustrative aspect of the invention.

A thermal compression technique was used to create trigonal (m=3) stress distribution over the interior of an optical window, as schematically illustrated in FIG. 2 and described herein above. The procedure utilized two materials, a window and metal housing, having different thermal expansion coefficients. Windows of BK7 (for visible applications) and fused silica (for UV applications) were studied. While BK7 has a larger thermal expansion coefficient than fused silica, the stress optical coefficient of BK7 is smaller than the stress optical coefficient of fused silica. The metal housing, which applies trigonal symmetric force to the window, was chosen such to have a larger thermal expansion coefficient than the thermal expansion coefficient of the glass.

Before force is applied, a machine quality finish is applied to the edges of the window to provide uniform contact with the metal housing and to ensure the edges are perpendicular to the faces. In this non-limiting, exemplary aspect, the nominal outer diameter of the window was 1.26 cm. A hole that was about 25 µm smaller than the diameter of the window was cut in the metal housing. Material was then removed from the inside of the metal housing in three regions, each 120 degrees apart, to provide trigonal symmetry and produce at least one wave of retardation at the edge of the pupil of the system.

Both the glass and the metal were heated to a temperature of greater than 300° C. to allow sufficient differential expansion. The window was then placed in the metal housing and both materials were cooled. This resulted in a fixed and stable stress distribution (see FIG. 6), which is nearly uniform in the axial direction. The magnitude of stress is proportional to the difference in outer diameter between the window and metal housing at room temperature and can therefore be controlled by the choice of materials and the fabrication precision.

Figure 4:
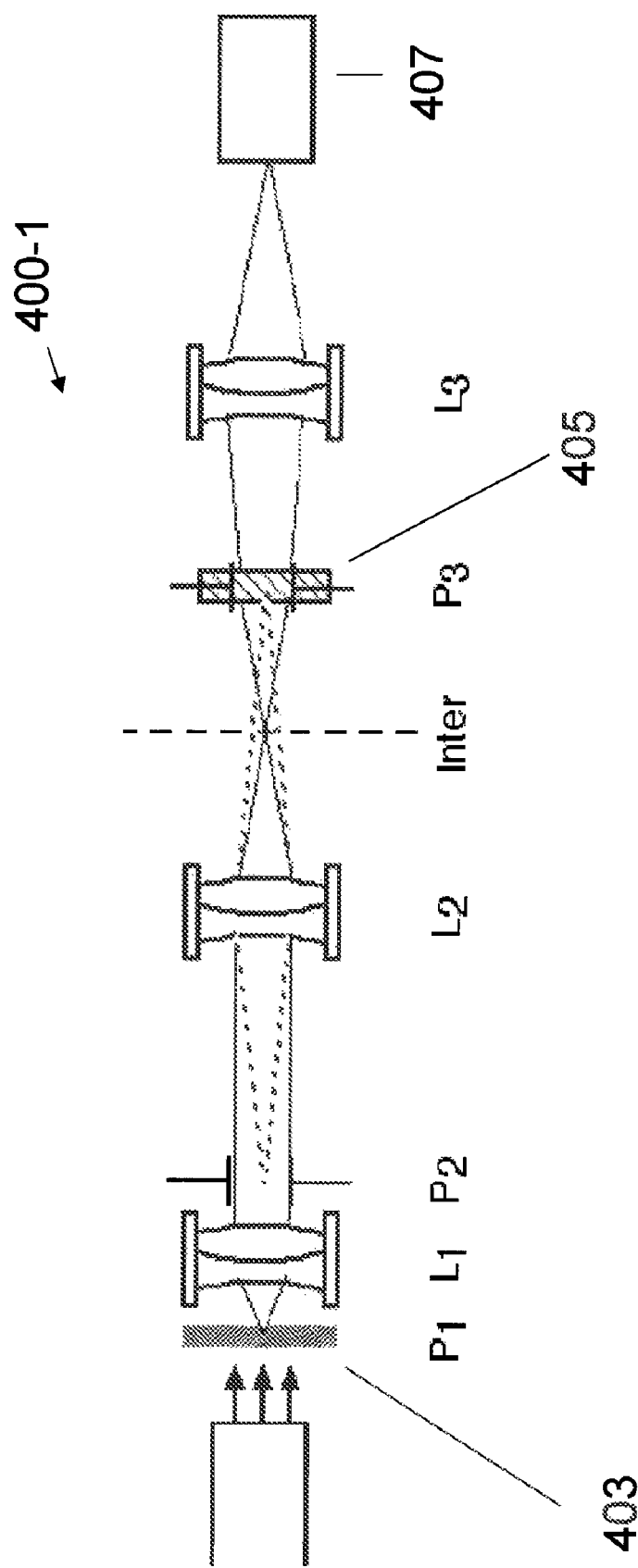
FIG. 4 shows an illustrative schematic of an experimental design of a system used for point spread function (PSF) measurement and imaging according to an exemplary aspect of the invention.

FIG. 4 shows a general schematic of an exemplary system 400-1 used for point spread function (PSF) measurement and imaging. An intermediate image of a target 403 is formed between lens L2 and pupil P3. A microscope objective L1 and a Bertrand lens L2 were configured to relay the pupil image at P2 to a plane at P3 containing the stressed window 405. A third lens, L3, functions as a relay lens to transfer the image to a CCD 407. The illustrated optical system had a NA equal to 0.06.

To explore the effect of a space-variant pupil polarization on the through-focus PSF, a star test was constructed using a spatially filtered/collimated beam from a HeNe laser. A 40× objective (NA=0.65) mounted on a computer controlled translation stage produced a point source. Through-focus images were then acquired and analyzed to extract the axial irradiance. In a related imaging experiment, in which the point source was replaced by an Air Force bar target illuminated by an LED, and incorporating a holographic diffuser and a condenser lens, a similar set of through-focus measurements was taken.

Figure 5:
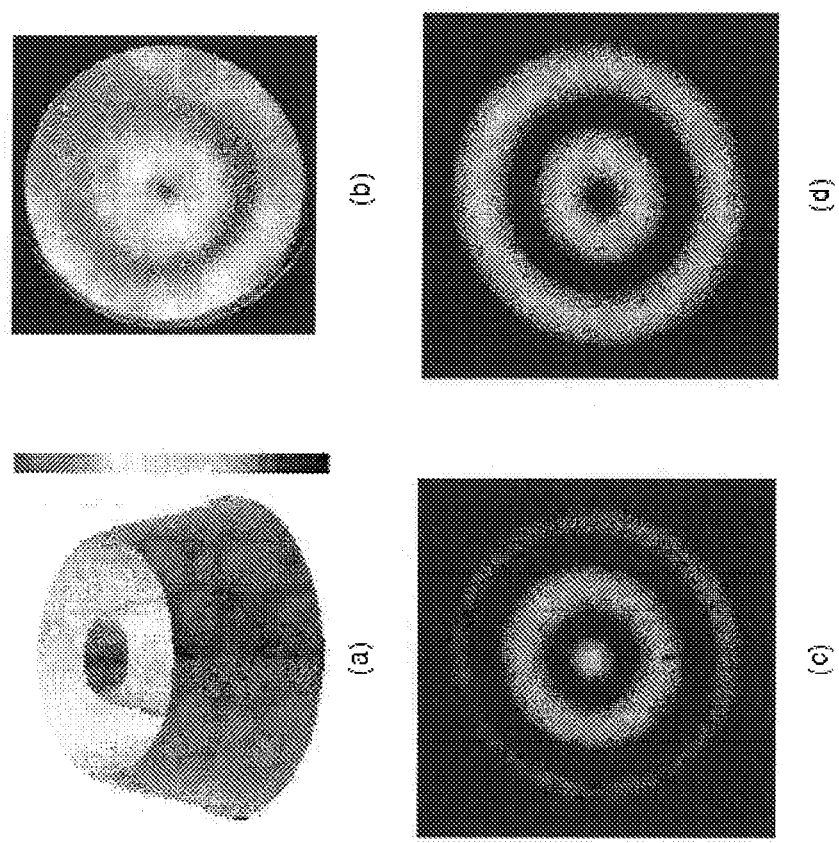
FIG. 5a shows a plot of computed irradiance of the left-hand circular (LHC) light shade-coded with phase.
FIG. 5b shows a photo-reproduction of the LHC component of a trigonally stressed window between circular polarizers.
FIG. 5c shows a pupil image of right-hand circular (RHC) light; and, FIG. 5d shows a pupil image of LHC light, according to illustrative aspects of the invention.

Knowledge of the wavelength, numerical aperture (NA), and stress parameter, c, are sufficient to completely describe the PSF. The NA was measured both by generating a diffraction limited PSF from an unstressed window and by estimating the cutoff frequency in the image of the bar target. The value of c (typically $c=4\pi$) was set by examining the right hand circular pupil image and adjusting an iris diaphragm to align with an integer number of waves of retardation. FIGS. 5c and 5d show exemplary pupil images.

Both the star test and the imaging experiment employed circularly polarized input light. For the star test, a polarized HeNe was followed by a quarter waveplate. For the imaging experiment, the unpolarized LED was passed through a linear polarizer and quarter waveplate. In order to analyze the polarization content of the image, an analyzer was placed after the stressed window. To analyze the content of circular polarization, for example, a combination quarter waveplate and linear polarizer (such as is typical in photography) was employed.

It is interesting to examine the pupil irradiance and the PSF for a pupil window having trigonal stress. When the stress is sufficient to produce two or more waves of retardation at the edge of the pupil ($c \geq 4\pi$), circularly polarized illumination produces a transmitted beam having alternating dark and bright fringes. These alternating dark and bright fringes are observed in the photographs in FIGS. 6a, b, where FIG. 6b is an enlargement of the central portion of FIG. 6a.

Contours of equal birefringence may be viewed using circular polarizers. The alternating dark and bright fringes correspond to alternating left and right circularly polarized rings. In FIG. 6, circularly polarized light is passed through the window and then through a circular analyzer, which passes right hand circular (RHC) light but blocks left hand circular (LHC) light. In such a view, the dark regions are contours of half-integer retardance (e.g., half-wave, one-and-one-half-wave, etc.), while the bright regions are regions of retardance equal to a multiple of one wavelength. Rings therefore have a wavelength-dependent radius, which is useful in understanding the structure of the PSF.

A full-λ waveplate when rotated will leave the phase of the transmitted wave unchanged. However, a half-λ waveplate (which transforms RHC to LHC light) will impart a phase proportional to twice the angle of the retarder. Thus the half-wave regions produce the LHC vortex predicted in Eq. (8). The total PSF at the paraxial focus is the superposition of two nearly identical irradiance distributions: a set of RHC rings without a vortex and a set of LHC rings with integer vortices. The result is a dominant ring with a half-integer vortex.

Because a full wave of retardation leaves the phase of a wave unchanged, the rings of right circular polarization exhibit no phase vortex. This was shown theoretically in Eq. (7), a result which also shows that successive rings have a π phase difference. In contrast, a half-wave of retardation does modulate the phase of circular polarization: right circular is converted to left circular with a phase that changes with twice the angle of the fast axis, as shown in Eq. (8). FIG. 5a shows the computed irradiance of the first half-wave ring shade (color)-coded with the phase, while FIG. 5b shows a photograph of a stressed window taken through a left circular analyzer. FIG. 5c shows a pupil image (LED illumination) of right circular light, and FIG. 5d shows the equivalent monochromatic pupil image of left circular light, showing the vortex rings.

Figure 7:
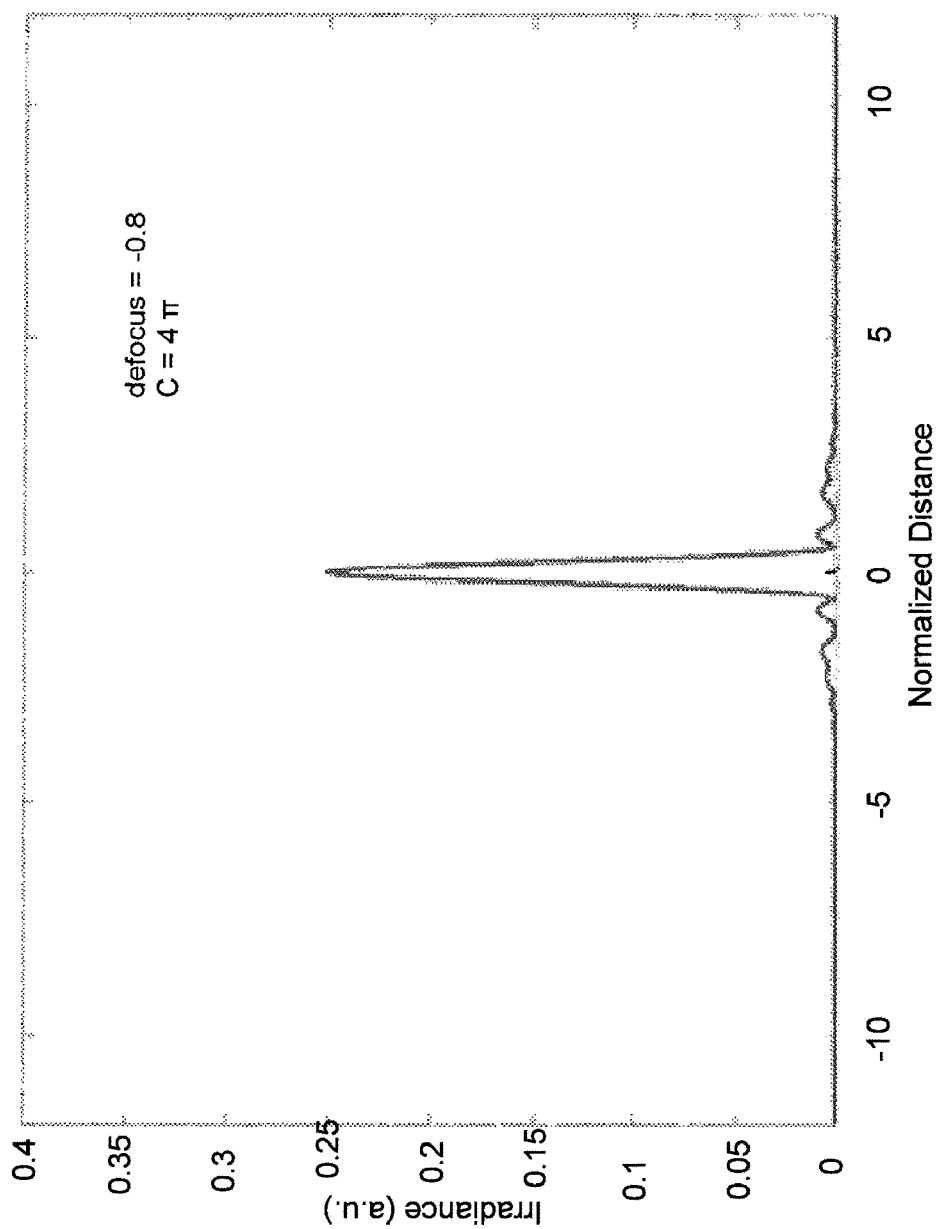
FIG. 7 is a graphical simulation of the PSF slice of a trigonally stressed window for varying values of defocus from $-2\lambda$ to $2\lambda$ according to an illustrative aspect of the invention.
Figure 8:
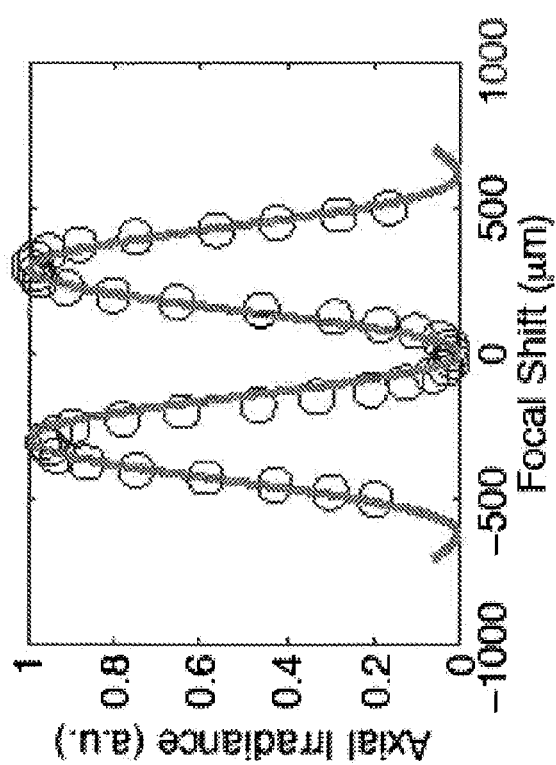
FIG. 8 is a comparative graph of experimental (circles) and theoretical (solid line) data showing axial irradiance as a function of focal shift according to an illustrative aspect of the invention.
Figure 9:
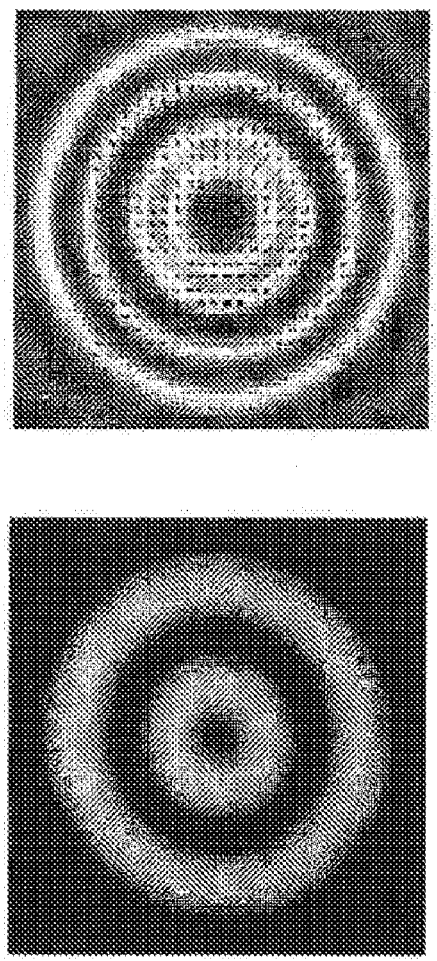
FIGS. 9a, b show a side by side comparison of experimental and theoretical simulated PSFs of a trigonally stressed window in the pupil plane of an NA=0.06 imaging system according to an illustrative aspect of the invention.

To study the through-focus PSF, a slice of the PSF is computed for values of the defocus varying from $-2\lambda$ to $+2\lambda$ as shown in FIG. 7. As the defocus changes, the PSF collapses to a nearly diffraction limited spot at about $\omega_D = -0.85\lambda$ and, after passing through the aberrated paraxial focus, collapses again, producing a second diffraction limited spot at $\omega_D = +0.85\lambda$ as illustrated in FIG. 8. The plots indicate the axial splitting of the focus induced by the trigonal stress. For a stress-induced retardance of two waves at the edge of the aperture ($c=4\pi$), the separation is about 300 µm. In FIG. 8, the circles represent experimental data and the solid line represents the theoretical curve. The numerical aperture (NA=0.06) determined from the experiment was used in generating the theoretical curve. FIGS. 9a, b show a side-by-side comparison of experimental and simulated PSFs for an NA=0.06 system.

Figure 12:
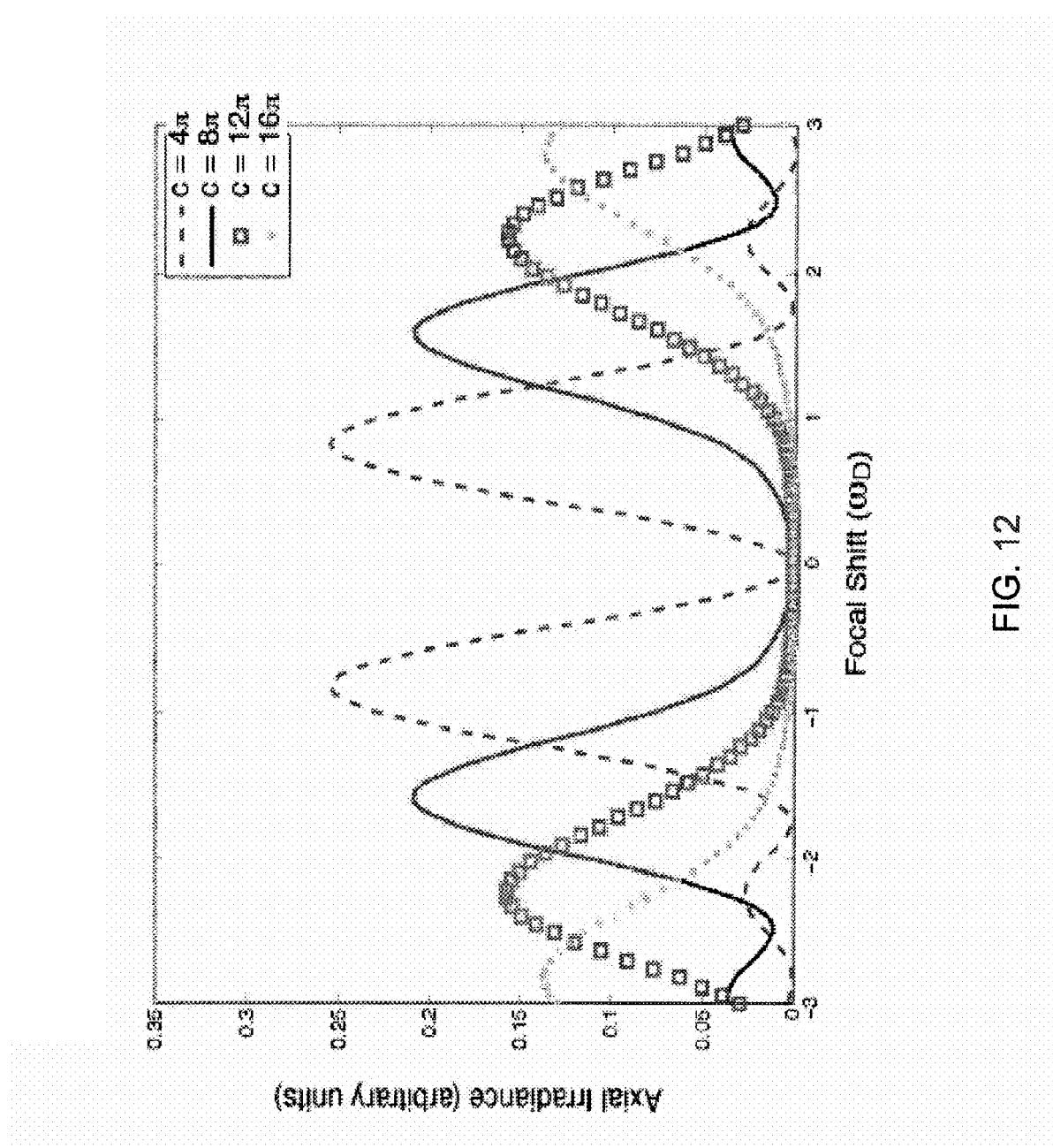
FIG. 12 is a graphical illustration showing relative axial irradiance for various values of applied stress, c, according to an illustrative aspect of the invention.

As further shown in FIG. 12, the computed axial irradiance peaks at about 25% of that for a perfect system, although the width of the focal spot is very close to a perfect Airy disk (see FIG. 7). The magnitude of the irradiance can be explained as follows: The transmitted light shown in FIG. 12 has both right and left circular components. The left circular component, which is roughly half of the total transmitted light, does not contribute to the axial irradiance. The remaining half of the total transmitted light, the right circular component, is split equally between the two foci, yielding about 25% of the energy in each focus.

Figure 10:
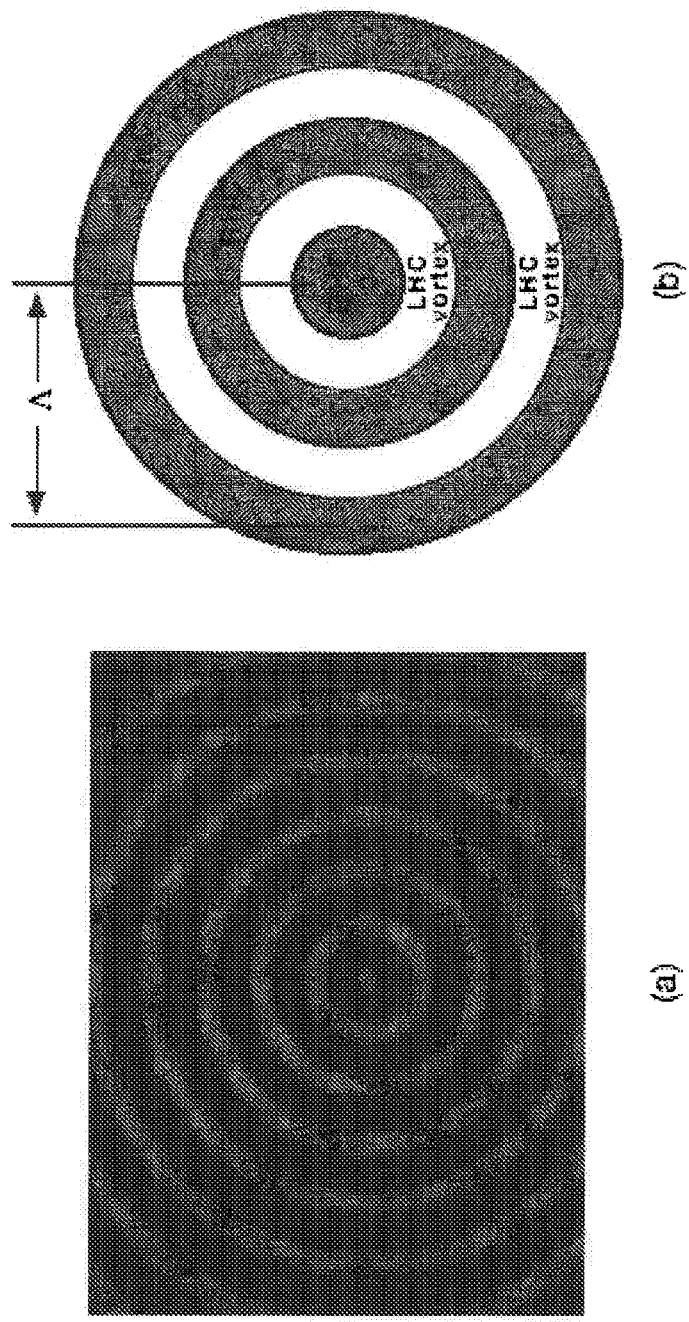
FIG. 10a shows an experimental pupil image.
FIG. 10b schematically illustrates the structure and phase of the alternating rings of RHC and LHC light according to an illustrative aspect of the invention.

A non-limiting, exemplary double-focus system created by a stressed window as described herein can be further understood with reference to the alternating transmitted RHC rings using a zone plate style amplitude modulation as shown in FIG. 10. The zone plate has alternating states of polarization with right hand circularly polarized rings and neighboring $\pi$ out-of-phase rings with a vortex that are left hand circularly polarized. By analyzing the RHC rings, the zone plate appears as a long period diffraction grating with a period, $\Lambda$, just short enough to produce two distinct foci.

Figure 11:
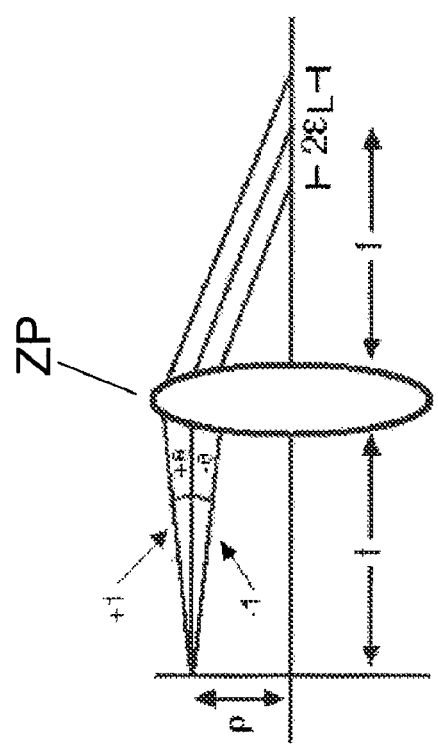
FIG. 11 is a first-order optics schematic illustrating the two foci of a stressed window according to an exemplary aspect of the invention.

We consider the pupil as a small section of a zone plate consisting of a radial grating period $\Lambda$, and apply small angle diffraction theory as follows. If the phase has the radial dependence $\Delta\phi = k_0 \kappa \rho t$, in which $\rho$ is the radial coordinate, t is the thickness, $k_0 = 2\pi/\lambda$ is the vacuum wave vector and $\kappa$ is the rate of change of birefringence near the center of the window, then the grating period (measured in units normalized to the pupil radius) is given as $\Lambda = \lambda/\kappa t$. For small diffraction angles, an axial ray will be deflected by $\theta = \pm\kappa t$. The first-order optical schematic layout of FIG. 11 illustrates that, if the zone plate, ZP, is placed in the front focal plane of the lens, the longitudinal separation of the focal spots, $|2\epsilon_L|$, will be $$|2\epsilon_L| = 2f\kappa t/(NA). \quad (10)$$

This can be related to the normalized stress parameter c ($c=2\pi\kappa t/\lambda$) such that the focal separation can be expressed as follows:

$$|2\epsilon_L| = c\lambda/2\pi(NA)^2 \quad (11)$$

The pupil defocus can also be related to the physical shift. The longitudinal shift $\epsilon_L$ of an axial ray is proportional to the gradient of the wavefront. For defocus, $$|2\epsilon_L| = 4\omega_D/(NA)^2 \quad (12)$$

Equating the expressions for longitudinal separation, $|2\epsilon_L|$, gives defocus in terms of the normalized stress parameter and wavelength as:

$$\omega_D = c\lambda/8\pi. \quad (13)$$

By varying the amount of stress, c, the separation of the foci changes. FIG. 12 illustrates axial irradiance plots for various values of applied stress, c. As the applied stress increases, the focal separation increases as well. The bar above each irradiance plot shows that the focal splitting is proportional to c, which is consistent with the geometrical theory. For the case where $c=4\pi$, $\omega_D=\lambda/2$.

Eqs. (11-13) summarize the dependence of the focal splitting on NA and wavelength, both in terms of the defocus parameter and the absolute focal shift. The wavelength dependence of the retarder balances the usual dispersion of a zone plate to yield a diffraction angle that is approximately achromatic, depending on $\lambda$ only through the material dispersion. As desired, a lens could be designed to balance the dispersion of the birefringence and produce a truly achromatic focal splitting.

Figure 13:
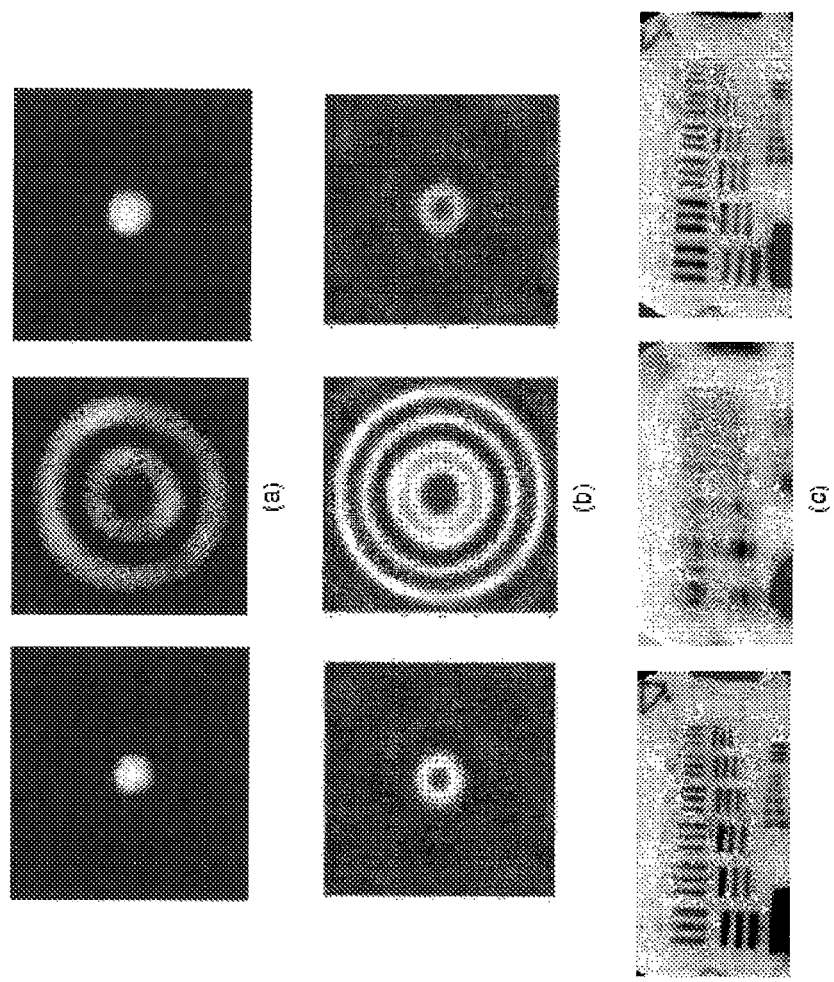
FIGS. 13a, b, respectively, show experimental PSFs and predicted PSFs at first focus, paraxial focus and second focus.
FIG. 13c shows an illustrative target positioned at each focus (left and right) and midway between (middle image), according to an illustrative aspect of the invention.

If the two, split focal planes and the paraxial focus are isolated, the theoretical and experimental PSFs can be compared with the real effect of defocus on a target. FIGS. 13a, b illustrate (left to right) the first focus, paraxial focus and second focus for the star test and imaging experiment, respectively. The Figures demonstrate that the two foci are approximately one wave of defocus in each direction from the paraxial focus. To demonstrate the principle, FIG. 13c shows Air Force bar target images at the first focus, paraxial focus and second focus. The target was illuminated by an LED-based condenser and imaged with a 2.5× microscope objective equipped with a window in the pupil having trigonal stress.

According to an alternative illustrative aspect of the invention, a symmetric four point stress was applied to a window, as described herein above, to achieve axial focal splitting. As described above, for a window under stress applied about its periphery, the order of the symmetry determines the functional form of the birefringence near the center of the window. For three point stress, the birefringence is linearly proportional to radius and the window will behave like a radial transmission grating. Four point stress creates birefringence that depends quadratically on radius, and the inner portion of the window will appear similar to an achromatic version of a Fresnel zone plate.

Figure 14:
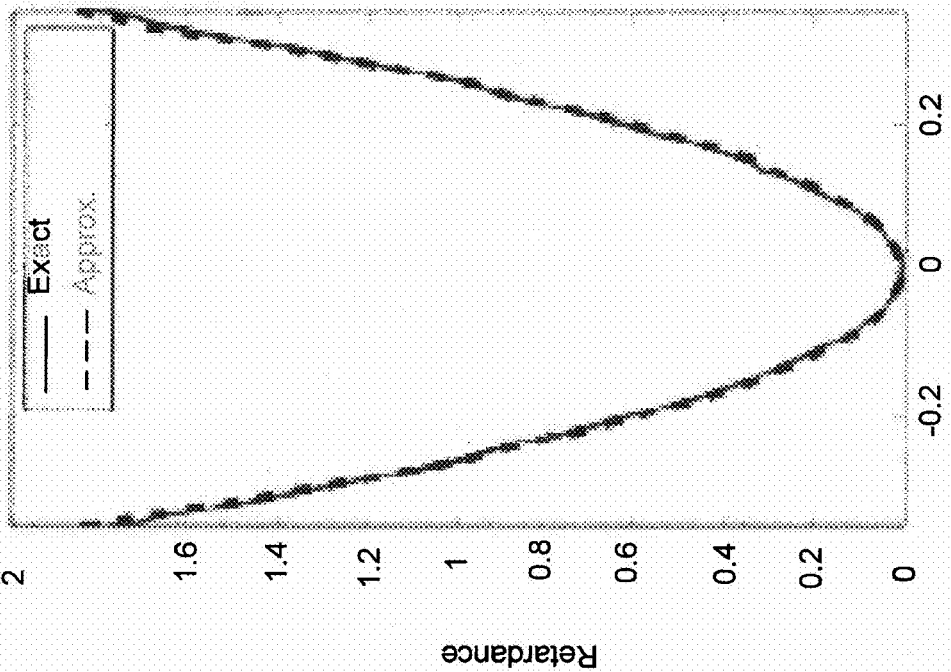
FIG. 14a is a simulated map showing contours of equal retardance for four point symmetric stress.
FIG. 14b is a line plot comparing the exact retardance with the quadratic approximation, according to an illustrative embodiment of the invention.
Figure 14:
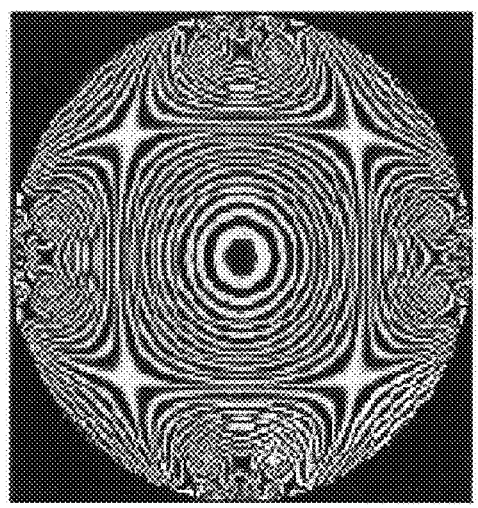

A simulation map of an ideal four point stress pattern is shown in FIG. 14a, in which all forces are precisely balanced in order to create circular contours of constant phase retardance near the center of the window. The contours of constant retardance work together to create an aperture similar to that of a Fresnel zone plate in which the separation between successive rings varies with the square root of the radius. FIG. 14b is a line plot comparing the exact retardance with the quadratic approximation.

Mathematically, the four point stress pattern produces an apodization of the right hand circular light as follows:

$$\cos(c\rho^2) = \frac{1}{2}\left(e^{ic\rho^2} + e^{-ic\rho^2}\right),$$

in which the parameter c represents the phase retardance at the edge of the pupil. The peak irradiance occurs when one of the terms exactly cancels the defocus.

Figure 15:
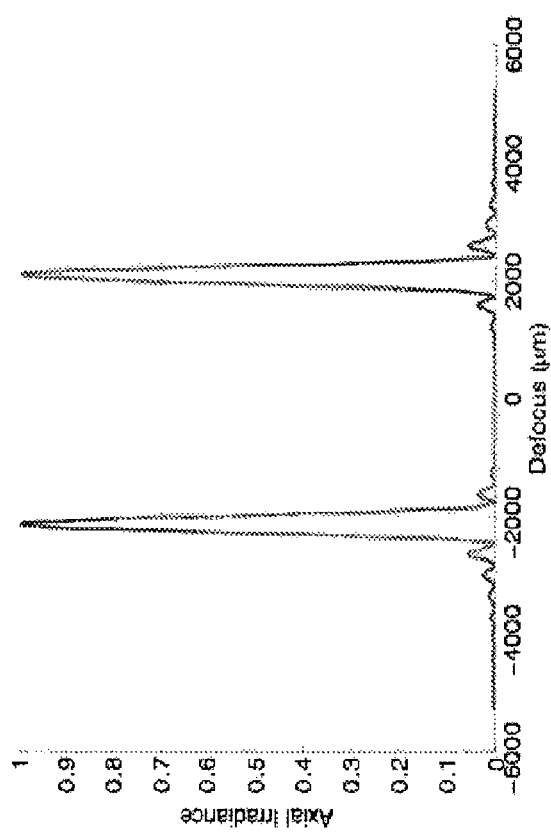
FIG. 15 shows a graph of axial irradiance versus defocus for symmetric four point stress with a phase retardance of $12\pi$ at the edge of the aperture, according to an illustrative aspect of the invention.
Figure 16:
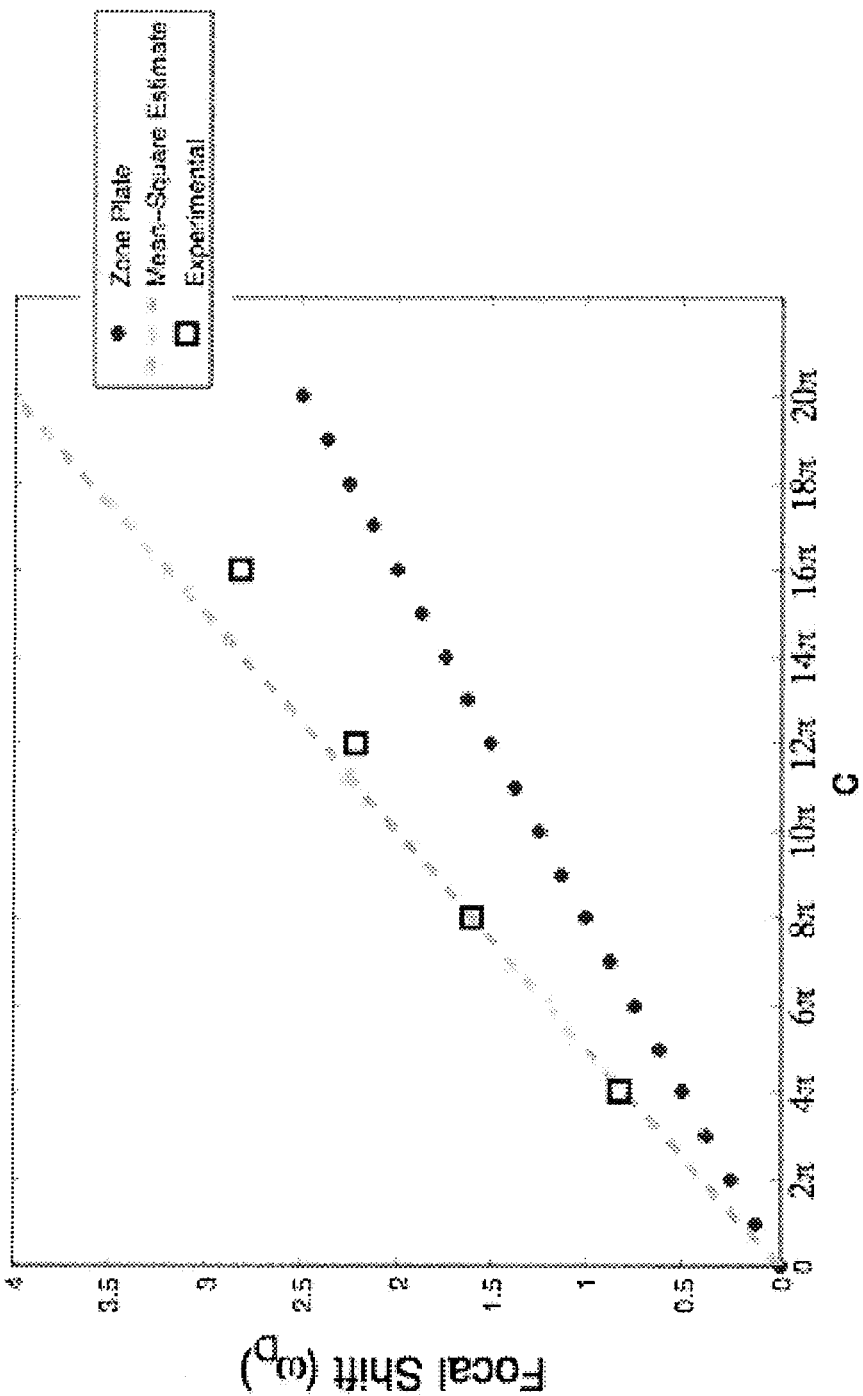
FIG. 16 shows a graph of focal shift (in wavelengths of defocus in the pupil) versus stress parameter c. The square symbols show the result of an exact integration, the top (dashed) curve shows the result from a mean squared error estimate, and the bottom (dotted) curve shows the estimate based on the zone plate model.
Figure 17:
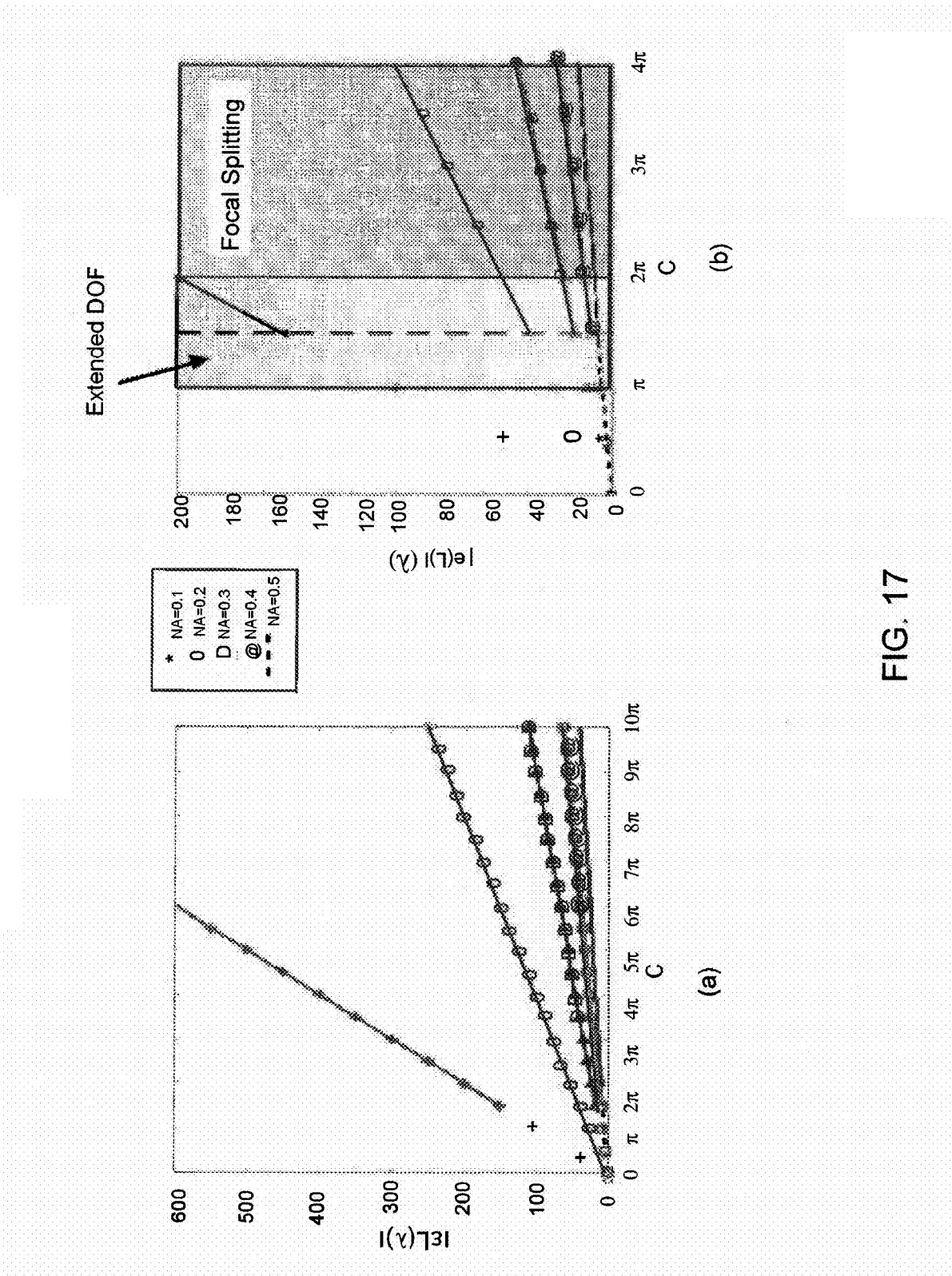
FIG. 17a shows a graph of focal shift (measured in wavelengths along the optical axis) versus stress parameter for a variety of numerical apertures.
in FIG. 17b, the vertical dotted line marks the conventional depth of focus for each numerical aperture, where the region between $c=\pi$ and $c=2\pi$ is the range of stress over which the system will experience an extended depth of focus, and where beyond $c=2\pi$, the system exhibits a focal splitting that increases linearly with the stress parameter.

In contrast to the case of three point stress, which produces high quality but imperfect foci, four point stress can produce a diffraction limited focus even for large focal splitting distances. FIG. 15 shows the focal splitting for a NA=0.06, a wavelength of 633 nm and a phase retardance of $12\pi$ at the edge of the aperture.

For the exemplary case of symmetric four point stress, retardance values greater than one wave and, more particularly, on the order of two waves, are sufficient to produce efficacious axial focal splitting.

According to an embodiment of the invention, the stressed 'window' polarization converter described herein above and in the parent application can alternatively be replaced by an optical 'lens' (i.e., refractive element with optical power) subject to the symmetric peripheral stress as in the 'window' embodiment.

Figure 18:
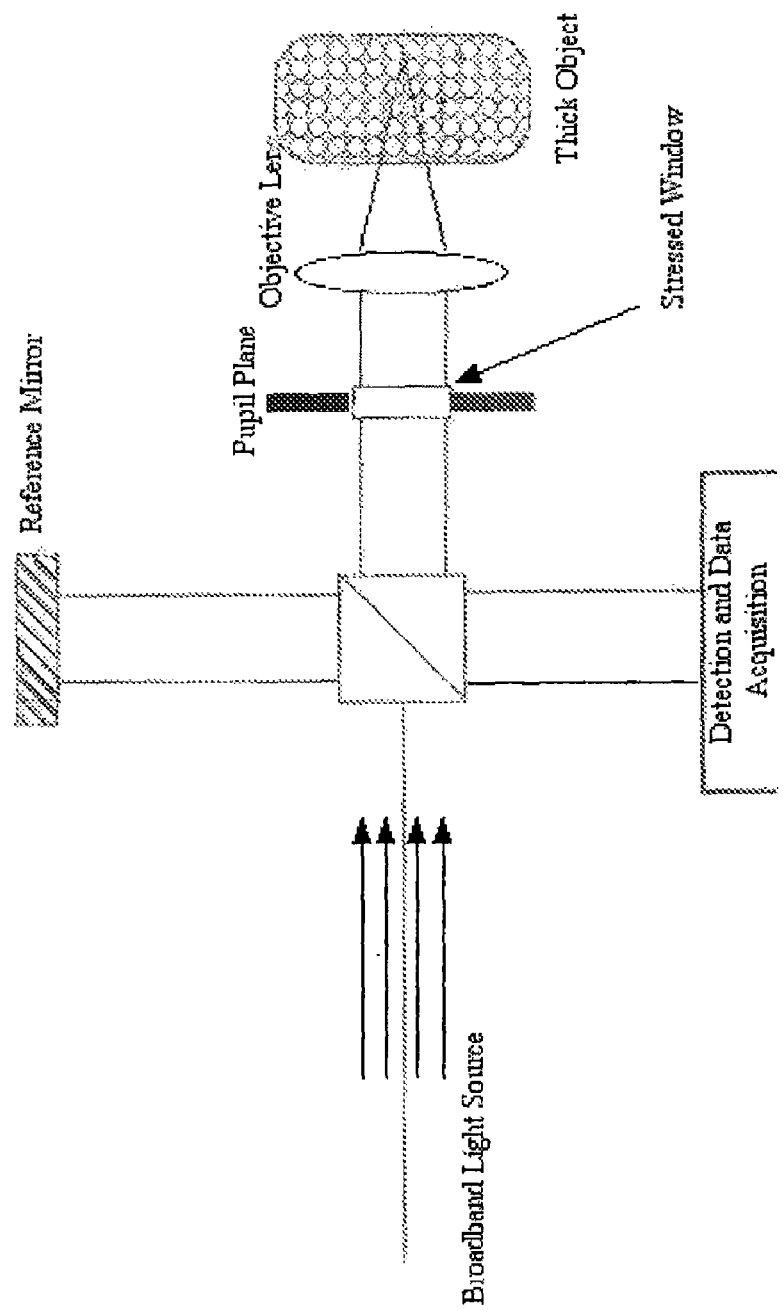
FIG. 18 schematically illustrates a single lens imaging system, in which a symmetrically stressed, positive lens is located at the pupil of the system, producing an axial splitting of the images according to an exemplary embodiment of the invention.
Figure 18:
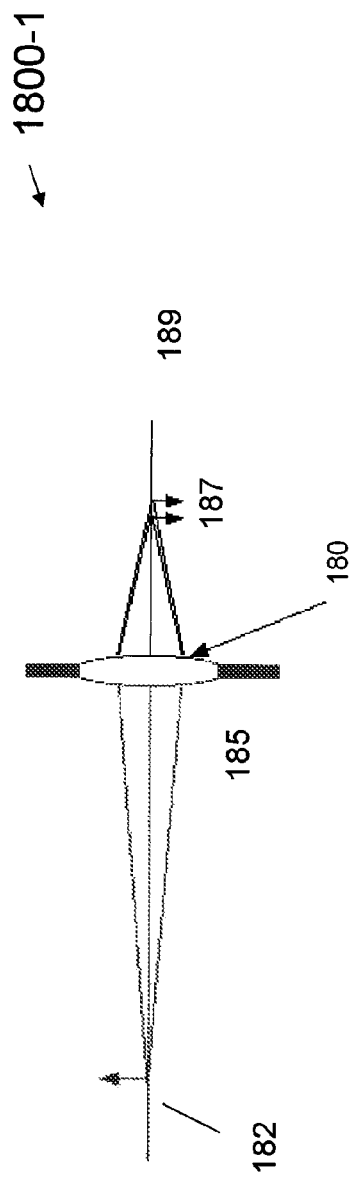

FIG. 18 shows an exemplary optical imaging system 1800-1 including a single element, positive lens 180 that is subject to a symmetric stress as described herein. The stressed lens is located in an aperture stop 185 along the optical axis 189 and forms two axially-split, inverted, real image 187 of an object 182.

Figure 20:
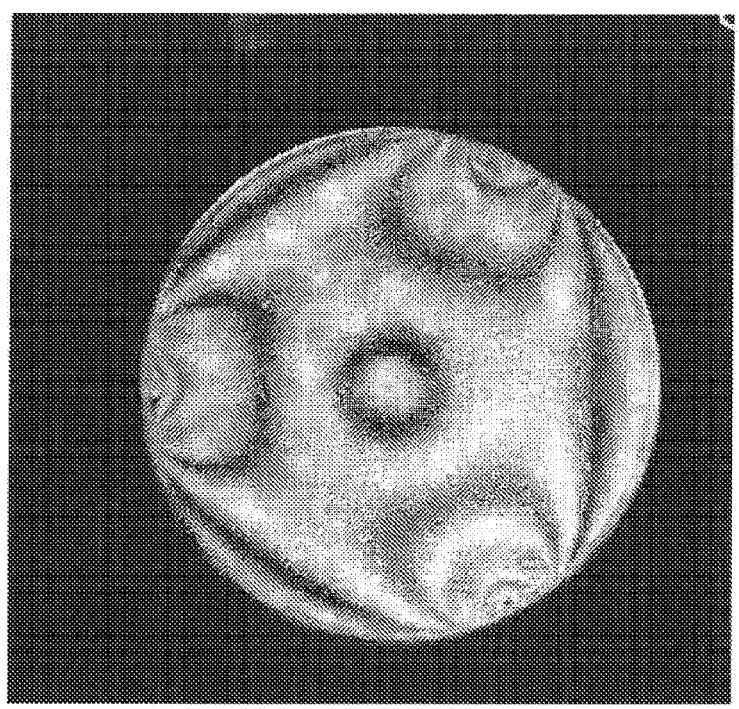
FIG. 20 shows a photograph of a simple positive lens under trigonal stress.

FIG. 20 is a photo reproduction of the induced stress pattern in an actual positive lens 201 subject to symmetric trigonal stress.

Figure 19:
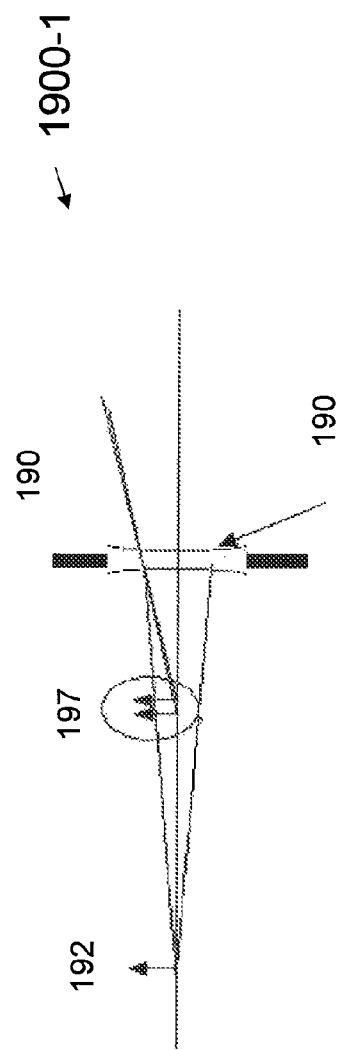
FIG. 19 schematically shows a single lens imaging system, in which a symmetrically stressed, negative lens is located at the pupil of the system, producing two virtual images of an object according to an exemplary embodiment of the invention.

FIG. 19 shows an exemplary optical imaging system 1900-1 including a single element, negative lens 190 that is subject to a symmetric stress as described herein. The stressed lens is located in an aperture stop 195 along the optical axis 199 and forms two axially-split, upright, virtual images 197 of an object 192.

Figure 21:
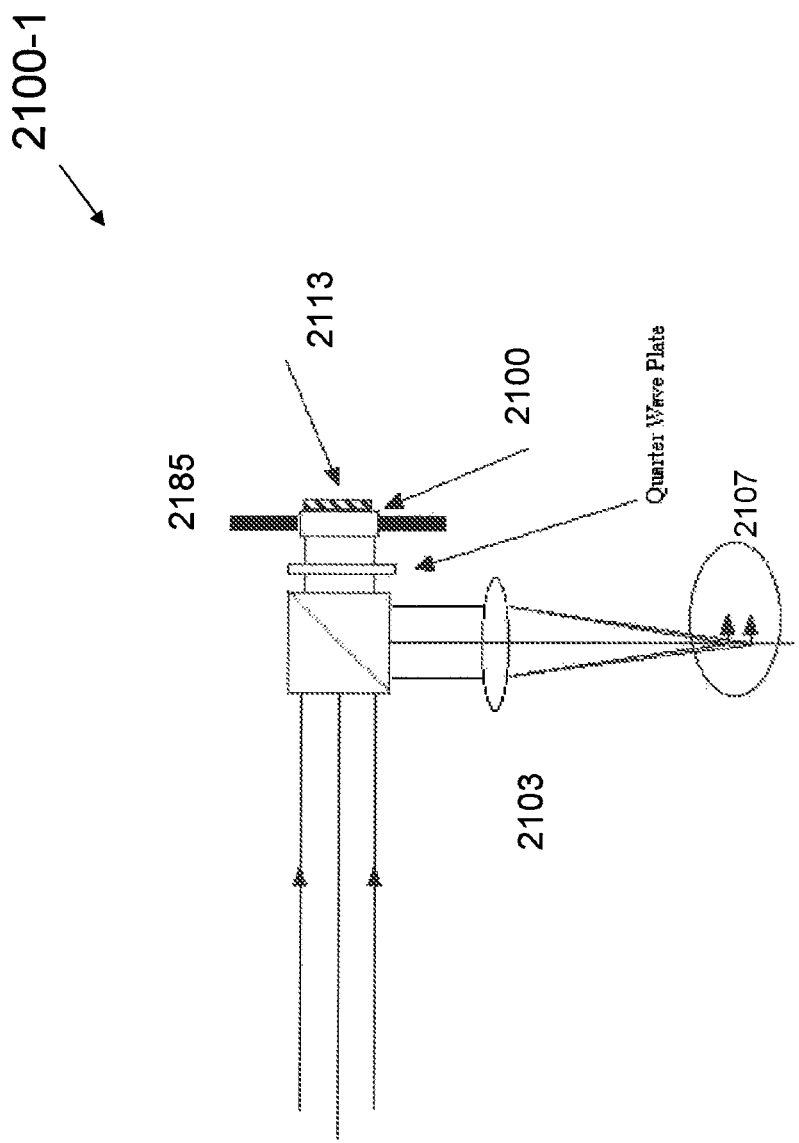
FIG. 21 shows a schematic top view of a stressed window used in a reflective design according to an exemplary embodiment of the invention.

An alternative exemplary embodiment is described with reference to the illustrative optical system 2100-1 shown in FIG. 21. As shown, a stressed window 2100 has a reflective coating 2113 on a rear surface of the window. In the illustrative reflective optical imaging system 2100-1, input light enters a polarization beamsplitter that transmits horizontal polarization. The light is converted to right hand circular using a quarter waveplate. The LHP rings of the reflected light are then converted to vertically polarized light and directed by the polarization beam splitter toward the imaging lens 2103. The result is focal splitting in the rear focal region 2107 of the lens.

According to a non-limiting exemplary embodiment of the invention, an optical system includes a stress-induced polarization converter (window or lens) as described herein above located at the pupil plane of an imaging system. In an aspect, if a lens is situated to focus a collimated beam, an aperture may be placed in the front focal plane and the window placed in close proximity to or in the aperture. Advantageously, the aperture may have a diameter not larger than the largest concentric ring of equal retardance, and may have a diameter less than about one-half of the diameter of the window. A circularly polarized input light source or assembly is placed optically upstream of the window. If the input light is fully polarized, this may be accomplished by a suitable waveplate. If the light is unpolarized, this may be accomplished by employing a linear polarizer followed by a quarter-waveplate, as is customary for photographic polarizing filters.

In one aspect, the window is followed by a circular analyzer that passes only the type of polarization that was originally incident on the window, rejecting the other light. For example, if the input light is right-hand circularly polarized, the analyzer should be a right-hand circular analyzer. This can be accomplished by following a quarter-waveplate with a linear analyzer. The orientation of the wave plate to the analyzer will determine whether the filter passes right or left circularly polarized light.

Exemplary, Non-Limiting Application Embodiments of the Invention

1. Confocal Microscopy

Microscopy is utilized to detect phase or gradient changes in materials. Conventional confocal microscopy can provide both axial and lateral resolution in a single focal plane. Embodiments according to the invention would allow the construction of a confocal microscope that can collect backscattered light from two planes simultaneously.

According to an illustrative aspect, a method for providing three-dimensional images using a reflection confocal microscope includes transmitting a circularly polarized beam through an apparatus comprising a stress-induced polarization converter; directing the transmitted beam into the scanning system of a confocal microscope; scanning the two focal spots across the sample; passing the reflected and/or backscattered light back through said apparatus; and, detecting the reflected and/or backscattered light in a confocal manner.

According to another illustrative aspect, a method for providing three-dimensional images using a transmission confocal microscope includes transmitting a circularly polarized beam through an apparatus comprising a stress-induced polarization converter; directing the transmitted beam into the scanning system of a confocal microscope; scanning the two focal spots across the sample; collecting the transmitted light through a collection lens; and, detecting the transmitted light in a confocal manner.

2. Biological Microscopy

Differential Interference Contrast

Differential imaging is a method by which light passing through two points on a sample-usually two points in close proximity-will interfere constructively or destructively depending on the path difference of light passing through each focus. Lateral differential interference contrast (DIC) produces laterally displaced foci. DIC provides a way to image transparent objects such as cell structures with weak variations in refractive index.

Embodiments according to the invention could allow the use of longitudinally displaced foci without the need for anisotropic crystals. Waves passing through the two foci would be passed through an identical lens/window combination in reverse. Variations in refractive index could be mapped onto phase differences between the two foci. If done in reflection, the phase difference will reflect the optical constants of the region between the two foci.

3. Semiconductor Reticle Inspection

Masks and reticles for optical lithography often have several planar regions that each require inspection. For example, a phase mask is equipped with trenches to provide the necessary phase shift. A very high numerical aperture microscope often cannot capture both the top and bottom of the trench simultaneously. A double focus system such as that described herein could, when combined with a confocal or similar microscope, image both surfaces simultaneously.

4. Inspection of Thin Glass Plates

The use of very large, high quality glass plates for liquid crystal displays and high definition televisions requires inspection techniques that can interrogate both surfaces simultaneously. Embodiments according to the invention allow a system in which one focus is placed at each surface and the surface is scanned in a reflection/confocal geometry.

5. Ophthalmic Imaging

Embodiments according to the invention could be used in ophthalmic imaging. Ophthalmic imaging with a stress birefringence waveplate could be done using a scanning opthalmoscope, in which a retinal image is created in a confocal-style scanning system. The advantage of this system over conventional scanning ophthalmoscopes would be the acquisition of two layers simultaneously without the need for subsequent image registration.

6. Optical Data Storage

In optical data storage, data is recorded by encoding features in a pattern that can be read back by a tightly focused laser beam. An optical disk, such as a CD, is an example of an optical data storage system where a tightly focused laser beam is precisely focused on a disc that contains encoded features, such as grooves and pits. The encoding of data may be done by means of material birefringence, refractive index, or surface height. The use of a double focus lens such as is described herein according to an aspect of the invention offers the possibility of expanding the number of layers that can be simultaneously interrogated by a single beam, thus expanding the capacity of an optical disk by about a factor of two.

7. Extended Depth of Field

A trigonally stressed window, for example, could be used for extended depth of field imaging to get the highest possible resolution. A conventional system has a depth of field of approximately $1.3\lambda/NA^2$. With the stressed window, the longitudinal separation of the focal spots can exceed this value; as the axial irradiance plot shows (FIG. 12), the stressed window could be used to elongate the axial region. By increasing the depth of field, the range of object positions over which the image will remain clearly resolved increases.

8. Optical Coherence Tomography (OCT)

Embodiments according to the invention could be utilized in optical coherence tomography (OCT). OCT is of particular interest in biological imaging because it is a method of imaging that produces images with higher resolution than provided by ultrasound or MRI. OCT is based upon interferometry whereby the incident light is divided into two components that travel different paths. While only one component of the light travels through the sample, both components travel equal path lengths. The two components are then recombined to interfere and produce images of the sample. Mirrors are typically used to scan the sample and image multiple points on the sample. By coupling a trigonally stressed window, for example, into an OCT system, two focal planes within a sample can simultaneously be imaged.

Figure 22:
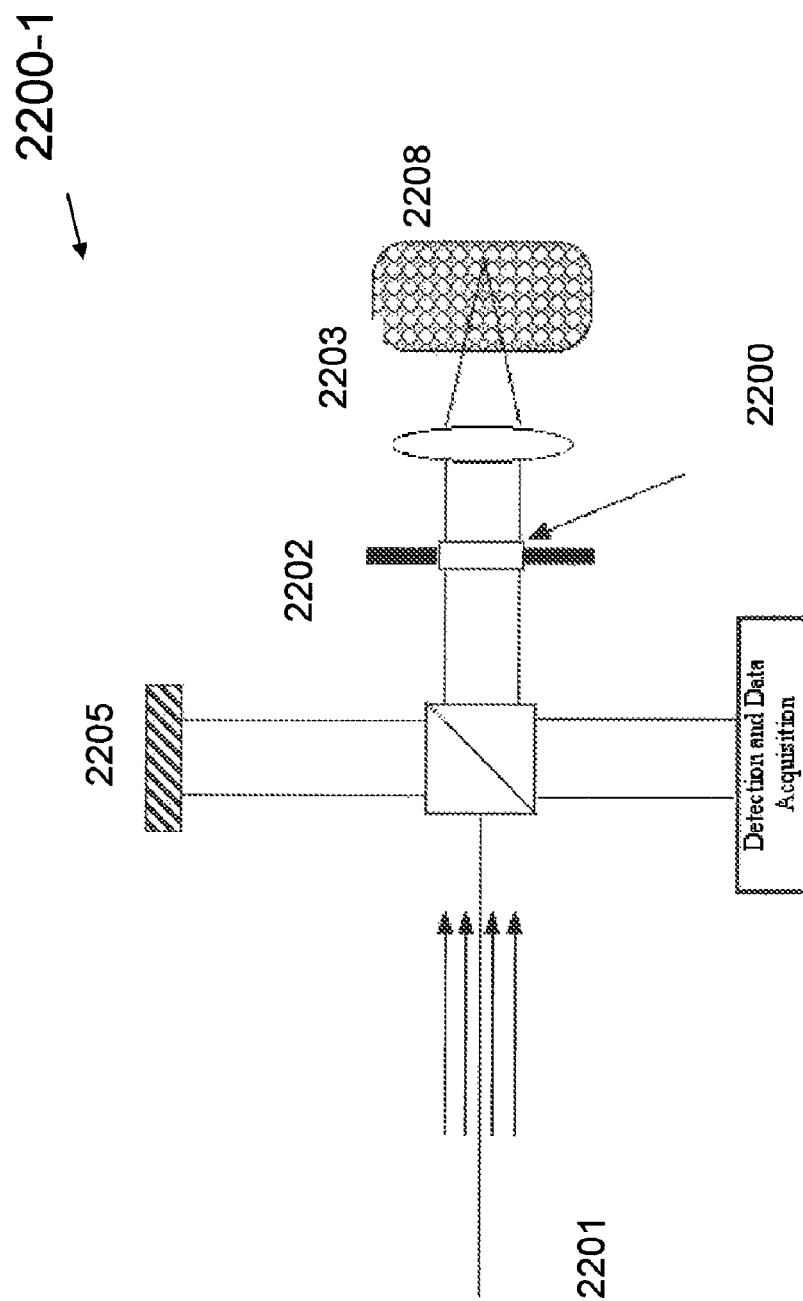
FIG. 22 schematically shows an optical coherence tomography (OCT) system according to an illustrative embodiment of the invention.

FIG. 22 schematically shows an optical coherence tomography system 2200-1 according to an exemplary embodiment of the invention. The system includes a broadband source 2201 incident on a beam splitter, which directs the input light along one path to a reference mirror 2205, and along another path through a stress-induced polarization converter window 2200 and a focusing objective 2203 to a thick object 2208. The stressed window, located in the front pupil plane 2202 of the objective lens produces two axially separated focal spots. Light from the reference path interferes only with light from the object that exactly equalizes the optical path difference between the two arms. Thus either focus may be selected by adjustment of the reference mirror, extending the axial range of the OCT system.

Having thus described the various embodiments of the invention, it will be apparent to those skilled in the art that the foregoing detailed disclosure is presented by way of example only and thus is not limiting. Various alterations, improvements and modifications recognized by those skilled in the art, though not expressly stated herein, may be made and are intended to be within the spirit and scope of the claimed invention. Additionally, the recited order of processing elements or sequences, or the use of numbers, letters, or other designations, is not intended to limit the claimed processes to any order except as may be specified in the claims. Accordingly, embodiments of the invention are limited only by the following claims and equivalents thereto.

We claim:

1. A method for producing a plurality of axial illumination regions along the optical axis of an optical system, comprising:
    providing a transparent optical component disposed along an optical axis of the component;
    applying a controlled, uniform, symmetric peripheral stress to the come to increase birefringence of the component;
    transmitting a circularly polarized light through the stressed component; and
    simultaneously obtaining at least two foci of the transmitted light along the optical axis by the application of the controlled, symmetric peripheral stress.

2. The method of claim 1, further comprising applying a controlled, symmetric, peripheral trigonal stress having a stress parameter, c, that is equal to or less than $2\pi$.

3. The method of claim 1, further comprising applying a controlled, symmetric, peripheral trigonal stress having a stress parameter, c, that is equal to or greater than $2\pi$.

4. The method of claim 1, further comprising applying a controlled, symmetric, peripheral four-pole stress having a stress parameter, c, that is equal to or less than $2\pi$.

5. The method of claim 1, further comprising applying a controlled, symmetric, peripheral four-pole stress having a stress parameter, c, that is equal to or greater than $2\pi$.

6. The method of claim 1, wherein the transparent optical component is a single, refracting optical element having optical power.

7. The method of claim 1, further comprising changing a separation distance between the axial foci by changing a magnitude of the applied, symmetric peripheral stress.

* * * * *

UNITED STATES PATENT AND TRADEMARK OFFICE
CERTIFICATE OF CORRECTION

| | | |
|---|---|---|
| PATENT NO. | : 8,014,069 B2 | Page 1 of 1 |
| APPLICATION NO. | : 12/143165 | |
| DATED | : September 6, 2011 | |
| INVENTOR(S) | : Alexis K. Spilman and Thomas G. Brown | |

It is certified that error appears in the above-identified patent and that said Letters Patent is hereby corrected as shown below:

Column 16, claim 1, line 30 should read as follows: "...stress to the component to increase birefringence of the component;"

Signed and Sealed this
Sixth Day of December, 2011

David J. Kappos
*Director of the United States Patent and Trademark Office*